United States Patent [19]

Nishizawa et al.

[11] Patent Number: 4,469,766

[45] Date of Patent: Sep. 4, 1984

[54] METHOD OF FORMING CATHODE-RAY TUBE PHOSPHOR SCREEN

[75] Inventors: Masahiro Nishizawa; Kiyoshi Miura; Hiroshi Yokomizo; Osamu Sasaya; Yoshifumi Tomita, all of Mobara, Japan

[73] Assignee: Hitachi, Ltd., Tokyo, Japan

[21] Appl. No.: 442,627

[22] Filed: Nov. 18, 1982

[30] Foreign Application Priority Data

Nov. 25, 1981 [JP] Japan .................................. 56-187881

[51] Int. Cl.³ .............................................. G03C 5/00
[52] U.S. Cl. .................................... 430/23; 427/54.1; 427/64; 427/68; 427/197; 430/144
[58] Field of Search ................... 427/64, 68, 54.1, 197; 430/23, 26, 144

[56] References Cited

U.S. PATENT DOCUMENTS

| 4,273,842 | 6/1981 | Nonogaki et al. | 430/25 |
| 4,318,971 | 3/1982 | Nishizawa et al. | 430/26 X |
| 4,331,752 | 5/1982 | Yokomizo et al. | 430/26 X |

FOREIGN PATENT DOCUMENTS

| 571686 | 3/1959 | Canada | 427/197 |
| 1015896 | 1/1966 | United Kingdom | 427/197 |

Primary Examiner—Michael R. Lusignan
Attorney, Agent, or Firm—Charles E. Pfund

[57] ABSTRACT

For formation of a cathode-ray tube phosphor screen by causing a fluorescent material to adhere to a particle-accepting sticky surface formed uniformly on the inner surface of a face plate, phosphor particles are placed on the inner surface of the face plate and caused to slide physically over the particle-accepting sticky surface so as to be stuck thereto.

2 Claims, 3 Drawing Figures

METHOD OF FORMING CATHODE-RAY TUBE PHOSPHOR SCREEN

BACKGROUND OF THE INVENTION

This invention relates to a method of forming a cathode-ray tube phosphor screen and, more particularly, to a method of causing particles to adhere to a sticky surface.

To let particles adhere to a sticky surface, there has been proposed a commonly termed dusting process, in which particles are dispersed in air and blown at a high speed against the surface with a spray gun. In this process, particles pass at a high speed through the barrel of the spray gun, and during this time there results friction between particles. Therefore, where the particles are phosphor particles or the like, the particles experience pressure so that strain is produced in their crystals. This reduces the intensity of light emission by the electron bombardment, that is, with the phosphor screen formed from such phosphor particles the brightness of light emission from the phosphor screen is reduced.

SUMMARY OF THE INVENTION

The invention has been comprehended in the light of the above affairs in the prior art, and its object is to provide a method of forming a cathode-ray tube phosphor screen capable of obtaining a high quality phosphor film having a high density and a large thickness by causing particles to move over a particle-accepting sticky surface.

According to the invention, to accomplish the above object, there is provided a method of forming a cathode-ray tube phosphor screen by causing a fluorescent material to adhere to a particle-accepting sticky surface formed uniformly on the inner surface of a face plate comprising the steps of placing phosphor particles on the inner surface of the face plate, and causing the phosphor particles to slide physically over the particle-accepting sticky surface so as to cause the phosphor particles to be stuck to the particle-accepting sticky surface.

DESCRIPTION OF PREFERRED EMBODIMENTS

Now, the method of forming a cathode-ray tube phosphor screen according to the invention will be described in detail in conjunction with an embodiment thereof.

A material which is capable of being optically rendered sticky, for instance a material composed of 0.6% by weight of propylene glycol alginate ester, 3.5% by weight of diazonium salt, 0.005% by weight of surfactant (Pluronic L92 (trade name) manufactured by Wynandotte Chemical Co.) and water for the rest, is coated to a thickness of about $1\mu$ on the inner surface of the face plate of a 14" type color picture tube. Then a portion of the surface where a first color phosphor, for example, a green light-emitting phosphor is to be coated is exposed to ultraviolet light with a light intensity of about 15 W/cm² through a shadow mask. Thus, a particle-accepting sticky surface is formed in the exposed portion. Characteristics of the photo-sticky material are known from U.S. Pat. No. 4,273,842, for example.

Figure 1:
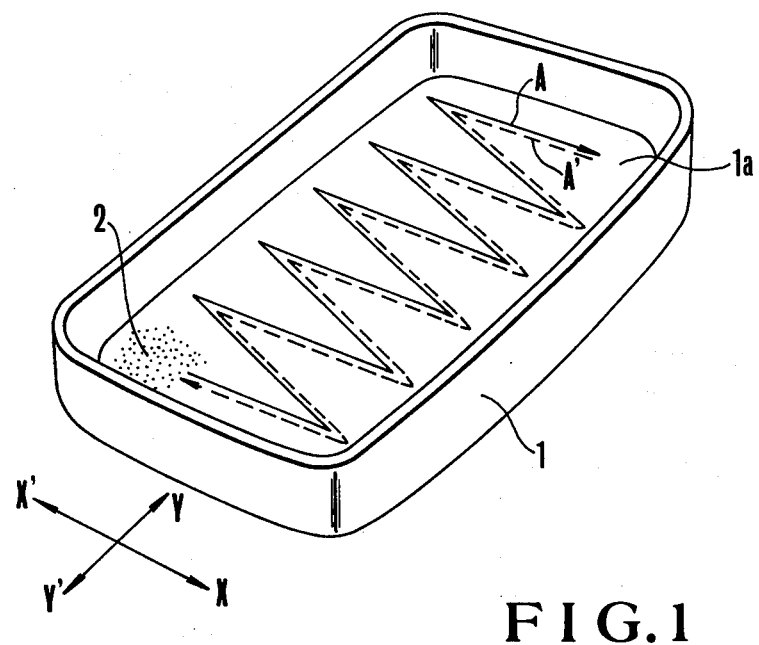
FIG. 1 is a perspective view showing a face plate for explaining an embodiment of the method of forming cathode-ray tube phosphor screen according to the invention.
Figures 2A, 2B:
FIG. 2a and 2b are diagrams illustrating the direction of tilting of the face plate.

The pattern of the sticky surface is determined by the phosphor pattern to be formed, corresponding to a pattern of stripes or dots of triads of blue, red and green, phosphor materials. Subsequently, the shadow mask is removed, and about 10 g of green phosphor particles 2 is placed on a corner portion of the inner surface of the face plate 1. The particles are then caused to move over the face plate 1 in a zig-zag fashion by alternate simultaneous tilting of the face plate 1 with respect to orthogonal directions, i.e., x and y directions as shown in FIGS. 2a and 2b. For example, the face plate 1 is tilted by an angle of $\alpha \approx 30°$ in the X—X' direction and by an angle of $\beta \approx 20°$ in the Y—Y+ to let the phosphor particles 2 slide over the face plate 1 along a zig-zag path from one corner to the other. As the phosphor particles 2 are moved over the face plate 1, some of them are stuck to the particle-accepting sticky surface noted above.

The apparent bulk density of the phosphor particles 2 in this case is 0.5 to 4.0 g/cm³. The phosphor particles 2 are moved at a speed of 5 to 10 cm/sec. As the phosphor particles are moved over the inner surface of the face plate 1 in the zig-zag path as shown by the solid arrow A, they are rendered into a massive state with a bulk density of 0.5 to 4.0 g/cm. After the mass of phosphor particles 2 has reached the diagonally opposed corner 1a of the face plate 1, it is now moved along a reverse zig-zag path as shown by the dashed arrow A'. This is done by alternately tilting the face plate 1 by the angles mentioned above so that the phosphor particles 2 proceed along the zig-zag paths. This operation is repeated to let the mass of phosphor particles 2 pass by one point on the face plate 1, for instance, 7 to 19 times. By doing so, the green phosphor particles 2 are caused to be stuck only to the exposed particle-accepting sticky surface to a thickness of approximately 3 mg/cm². In this case, approximately 0.01 mg/cm² of phosphor particles 2 are left on the unexposed portion of the face plate inner surface. The excess phosphor particles 2 are then removed from the face plate 1 by turning over the face plate 1. Finally, the phosphor particles 2 remaining on the unexposed portion are removed by blowing out dry air at a speed of 10 m/sec. from a spray gun with a slit having a width of about 0.2 mm and a length of about 10 mm which is disposed at a distance of approximately 150 mm from the inner surface of the face plate 1. A green phosphor pattern is thus formed only on the exposed particle-accepting sticky portion. Afterwards, a second color phosphor, for example, blue light-emitting phosphor, pattern is formed in the same manner as the formation of the green phosphor pattern except that this time the exposure is effected by placing the light source at the deflection center of the blue electron beam. Likewise, a third color, for example, red light-emitting phosphor pattern is also formed. In this way, a tri-color phosphor screen is formed.

With the process as described above, as the phosphor particles 2 are moved over the exposed particle-accepting sticky surface, some of them are directly stuck to the sticky surface to form a first phosphor layer. At this time, the interstices formed among the adhered phosphor particles provide a sort of capillary action, allowing the sticky material to ooze out to the surface of the first phosphor layer. As the free phosphor particles 2 move over the first phosphor layer 1, they are progressively trapped mechanically in the microprocesses defined by the phosphor particles in the first phosphor layer. The newly trapped phosphor particles again provide capillary action to cause ensuing ooze of the sticky material so that they are stuck to the previously stuck phosphor particles. By this phenomenon, the phosphor particles 2 are progressively stuck. Phosphor particles 2 thus will be uniformly stuck so long as the sticky material is uniformly coated. The thickness of the phosphor pattern film thus formed in unit time may be increased with increasing quantity of the phosphor particles 2 used and also with increasing speed of mass of phosphor particles 2.

Considering the relation between an amount of phosphor particles adhered to the sticky surface and a thickness of the phosphor particle film, the following has been proven.

More particularly, the amount of adhered phosphor particles will be small if the phosphor particles are simply slidden over the sticky surface. Also, the aforementioned sliding operation for the phosphor particles will not be performed smoothly if an excessive amount of phosphor particles is placed on the sticky surface. Therefore, it is necessary to supply the phosphor particles to the sticky surface at a proper amount or weight of the phosphor particles. Preferably, the amount of phosphor particles ranges from 0.2 g/cm$^2$ to 10 g/cm$^2$. Experiments showed that sliding time × sliding speed = constant
= about 2400 was established in the phosphor particle sliding motion. For example, when the speed is 20 cm/sec., as experimentally confirmed, 3 mg/cm$^2$ of phosphor particles is adhered to the sticky surface through 120 sec. or 2 min. sliding operation. In this case, the phosphor particles may be moved in the y direction at a suitable speed but preferably, 1 cycle/cm in the x direction and 0.15 cycle/cm in the y direction.

Table 1 below shows the results of experiments conducted to prove the superiority of the method described above according to the invention. In the experiments, a photosensitive film which becomes sticky through exposure to ultraviolet light was first formed by coating as mentioned above to a thickness of approximately 1μ on the inner surface of the face plate of a 14" type color picture tube and exposing the coated surface to ultraviolet light with a light intensity of approximately 15 W/cm$^2$ projected from a position corresponding to the deflection center of the green electron beam through a shadow mask. Then the green phosphor was deposited on the exposed portion of the sticky film thus prepared by the conventional dusting process and also by the process according to the invention. Thereafter, surplus green phosphor particles were removed by blowing with dry air to develop the exposed portion. The phosphor pattern films thus formed are compared to obtain the results of Table 1. Table 2 shows the results of comparison of the extent of cross-contamination of different colors in phosphor pattern films prepared by the dusting process and the process according to the invention.

TABLE 1

| | Thickness of film | Light permeability of film | Brightness (Eb = 23KV, IK = 200μA) | Variation of film thickness |
|---|---|---|---|---|
| Dusting process | 2.6 mg/cm$^2$ | 45% | 100 | ±10% |
| Process according to the invention | 3.0 mg/cm$^2$ | 36% | 130 | ±5% |

TABLE 2

| | Proportion in green phosphor film of | | Proportion in blue phosphor film of |
|---|---|---|---|
| | Blue phosphor | Red phosphor | Red phosphor |
| Dusting process | 0.4% | 0.7% | 0.6% |
| Process according to the invention | 0.1% | 0.15% | 0.15% |

These results of comparison were obtained by carrying out the dusting process and the process according to the invention under optimum conditions.

While the foregoing embodiment has been described by way of zig-zag motion of the phosphor particles over the sticky surface, it is also possible to use a great quantity of particles with respect to the sticky surface and moving the particles 2 to the left and right by alternately tilting the sticky surface to the left and right. As a further alternative, the sticky surface may be rotated if its size is small.

As has been shown, with the method according to the invention, in which phosphor particles are stuck on the sticky surface by causing the particles to slide as a mass over the sticky surface, a dense and thick phosphor film can be obtained compared to the conventional dusting process. Also, when the method according to the invention is applied to the formation of a phosphor screen of a color picture tube, the cross-contamination can be extremely reduced. Further, since phosphor particles can be stuck to the sticky surface without any stress exerted on one another, there results neither deterioration of the brightness due to mechanical rupture of phosphor particles nor separation of a pigment from phosphor particles in case of phosphor particles having the pigment attached to the surface by an organic binder. Further, by the method according to the invention a uniform film with little unevenness of the film thickness can be obtained, so that it is possible to obtain powder coating in a simpler way than the electrostatic powder coating which is applicable only to the electrically insulating materials.

As has been described in the foregoing, with the method of forming cathode-ray tube phosphor screen according to the invention it is possible to obtain a high quality phosphor film having high density, large thickness and high uniformity.

What is claimed is:

1. A method of forming a cathode-ray tube phosphor screen by causing a fluorescent material to adhere to a particle-accepting photo-sticky surface formed uniformly on the inner surface of a face plate comprising the steps of:
   applying a photosensitive composition which becomes sticky through exposure to ultraviolet light, to an inside surface of a faceplate of the color picture tube as a thin layer;

exposing the thin layer to ultraviolet light patternwise through a shadow mask, thereby making the exposed parts sticky;

placing phosphor particles on the inner surface of the face plate; and tilting said face plate simultaneously in orthogonal directions alternately to cause the phosphor particles to slide in a zig-zag fashion from one corner of said faceplate to the diagonally opposite corner and back to said one corner, thereby causing the phosphor particles to slide physically over the particle-capturing sticky surface so as to cause the phosphor particles to be stuck patternwise to the particle-retaining sticky surface.

2. A method of forming a cathode-ray tube phosphor screen according to claim 1 wherein a predetermined amount of phosphor particles is placed in one corner on the inner surface of said face plate, and tilt angles in the orthogonal directions are different.

* * * * *